United States Patent
Cody et al.

(10) Patent No.: US 9,093,269 B2
(45) Date of Patent: Jul. 28, 2015

(54) IN-SITU PRE-CLEAN PRIOR TO EPITAXY

(75) Inventors: Nyles W. Cody, Tempe, AZ (US);
Shawn G. Thomas, Gilbert, AZ (US);
Pierre Tomasini, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 196 days.

(21) Appl. No.: 13/332,211

(22) Filed: Dec. 20, 2011

(65) Prior Publication Data

US 2013/0153961 A1 Jun. 20, 2013

(51) Int. Cl.
*H01L 29/16* (2006.01)
*H01L 21/02* (2006.01)

(52) U.S. Cl.
CPC .... *H01L 21/02381* (2013.01); *H01L 21/02532* (2013.01); *H01L 21/02661* (2013.01)

(58) Field of Classification Search
CPC ............ H01L 21/0245; H01L 21/02057; H01L 21/02381; H01L 21/0243; H01L 21/02532; H01L 21/02573; H01L 29/7848; H01L 29/0847; C23C 16/0227; C23C 16/4408; C23C 16/45523
USPC ........... 438/507, 483, 689, 270, 306; 257/555
See application file for complete search history.

(56) References Cited

U.S. PATENT DOCUMENTS

| | | | |
|---|---|---|---|
| 5,766,999 A | 6/1998 | Sato | |
| 6,235,568 B1 | 5/2001 | Murthy et al. | |
| 6,475,865 B1 * | 11/2002 | Yang et al. | 438/270 |
| 6,537,370 B1 | 3/2003 | Hernandez et al. | |
| 6,620,743 B2 | 9/2003 | Pagliaro, Jr. et al. | |
| 6,749,687 B1 | 6/2004 | Ferro et al. | |
| 6,960,537 B2 | 11/2005 | Shero et al. | |
| 7,108,748 B2 | 9/2006 | Brabant et al. | |
| 7,238,595 B2 | 7/2007 | Brabant et al. | |
| 7,329,593 B2 | 2/2008 | Bauer et al. | |
| 2003/0036268 A1 * | 2/2003 | Brabant et al. | 438/689 |
| 2003/0080394 A1 * | 5/2003 | Babcock et al. | 257/555 |
| 2007/0117335 A1 * | 5/2007 | Sandhu et al. | 438/306 |
| 2007/0155138 A1 * | 7/2007 | Tomasini et al. | 438/483 |
| 2011/0117732 A1 * | 5/2011 | Bauer et al. | 438/507 |
| 2012/0244688 A1 | 9/2012 | Bauer et al. | |

* cited by examiner

*Primary Examiner* — Kenneth Parker
*Assistant Examiner* — Bo Fan
(74) *Attorney, Agent, or Firm* — Knobbe, Martens, Olson & Bear, LLP

(57) ABSTRACT

Methods for low temperature cleaning of a semiconductor surface prior to in-situ deposition have high throughput and consume very little of the thermal budget. $GeH_4$ deposits Ge on the surface and converts any surface oxygen to $GeO_x$. An etchant, such as $Cl_2$ or HCl removes Ge and any $GeO_x$ and epitaxial deposition follows. A spike in Ge concentration can be left on the substrate from diffusion into the substrate. All three steps can be conducted sequentially in-situ at temperatures lower than conventional bake steps.

37 Claims, 5 Drawing Sheets

IN-SITU PRE-CLEAN PRIOR TO EPITAXY

BACKGROUND OF THE INVENTION

1. Field of the Invention

This invention relates generally to methods for cleaning of a semiconductor surface, and relates more specifically to a method for low temperature, in-situ semiconductor cleaning in a deposition tool.

2. Description of the Related Art

High-temperature ovens, called reactors, are used to create structures of very fine dimensions, such as integrated circuits on semiconductor substrates. One or more substrates, such as silicon wafers, are placed on a wafer support inside the reaction chamber. Both the wafer and support are heated to a desired temperature. In a typical wafer treatment step, reactant gases are passed over the heated wafer, causing the chemical vapor deposition (CVD) of a thin layer of the reactant material on the wafer. Various process conditions, particularly temperature uniformity and reactant gas distribution, must be carefully controlled to ensure the high quality of the resulting layers.

Through a series of deposition, doping, photolithography and etch steps, the starting substrate and the subsequent layers are converted into integrated circuits, with a single layer producing from tens to thousands or even millions of integrated devices, depending on the size of the wafer and the complexity of the circuits.

Batch processors have traditionally been employed in the semiconductor industry to allow multiple wafers to be processed simultaneously, thus economically presenting low processing times and costs per wafer. Recent advances in miniaturization and attendant circuit density, however, have lowered tolerances for imperfections in semiconductor processing. Accordingly, single wafer processing reactors have been developed for improved control of deposition conditions.

Among other process parameters, single wafer processing has greatly improved temperature and gas flow distribution across the wafer. In exchange for greater process control, however, processing time has become even more critical than with batch systems. Every second added to processing times must be multiplied by the number of wafers being processed serially, one at a time, through the same single-wafer processing chamber. Conversely, any improvements in wafer throughput can translate to significant fabrication cost savings.

One process for which process control is particularly critical is the formation of epitaxial layers. If the deposited layer has the same crystallographic structure as the underlying silicon wafer, it is called an epitaxial layer. Through careful control of deposition conditions, reactant gases are passed over a heated substrate such that the deposited species precipitates in conformity with the underlying crystal structure, which is thus extended into the growing layer. As is known in the art, epitaxial layers can be formed of intrinsic or doped silicon, silicon germanium (SiGe), carbon-doped silicon (Si:C), carbon doped silicon germanium (SiGe:C) or other semiconductor materials. The lowest levels of devices, including transistors, are often formed within an epitaxial layer formed over a semiconductor substrate.

It is important that the epitaxial layers maintain a pure crystal structure, free of contamination which could affect device operation. The purity and crystalline structure of the underlying substrate prior to epitaxial deposition strongly affects the resultant epitaxial layer. Contaminants at the substrate surface, such as naturally forming "native oxide" and carbon contaminants, interfere with the crystal structure and consequent electrical properties of each overlying layer as it is formed, resulting in a polycrystalline layer. Note that clean, oxide-free surfaces are also desirable for a number of contexts other than epitaxial deposition.

Typically wafers are cleaned prior to deposition with an ammonium hydroxide, hydrogen peroxide mixture, known as an "APM" clean. The most popular cleaning methods involve one or more forms of an RCA cleaning procedure. The RCA Standard-Clean-1 (SC-1) procedure uses an APM solution and water heated to a temperature of about 70° C. The SC-1 procedure dissolves films and removes Group I and II metals. The Group I and II metals are removed through complexing with the reagents in the SC-1 solution. The RCA Standard-Clean-2 (SC-2) procedure utilizes a mixture of hydrogen peroxide, hydrochloric acid, and water heated to a temperature of about 70° C. The SC-2 procedure removes the metals that are not removed by the SC-1 procedure.

If an oxide-free surface is required, as is typically the case prior to epitaxial deposition, the silicon wafer is typically dipped into an aqueous solution of hydrofluoric acid or HF vapor treated to etch away the oxide layer left by an APM clean and, theoretically, obtain hydrogen termination. There are a large number of variations on RCA clean and hydrofluoric acid treatments and alternative "pre-clean" processes. After cleaning, wafers are typically stored for a period of time before further processing. A native oxide tends to form on the previously oxide-free silicon wafer surface almost immediately after exposure to air or moisture.

If the silicon wafer is dipped in hydrofluoric acid as the last cleaning step (also known as an "HF last" step), whether or not stored before processing, before processing the surface of the silicon is typically terminated mostly with a monolayer of hydrogen, attached to the substrate largely through Si—H bonds. The hydrogen-terminated surface resists oxidation more than untreated silicon. Nevertheless, there is always at least a risk of some oxidation. The surface of a silicon wafer after a conventional HF last treatment normally starts to reoxidize within about 20 minutes after the original oxide layer was removed, quickly forming a new 5 Å to 7 Å thick oxide layer on the surface of the silicon wafer. Even when processed immediately after an HF last, residual oxygen on the substrate can be too high for subsequent epitaxial deposition, especially at low temperatures.

Thus, most epitaxial processes start with a high temperature "bake" process, such as a hydrogen bake, to ensure removal of any remaining oxygen from semiconductor surfaces prior to epitaxial deposition. Such bake steps can be costly both from a wafer throughput and a thermal budget perspective. The problem of reoxidation after the HF last step has been detrimental to the high-throughput manufacturing of many silicon devices, but has been a particular hindrance in the deposition of epitaxial layers.

SUMMARY OF THE INVENTION

A need exists, therefore, for methods of purifying substrate surfaces prior to epitaxial deposition, and of maintaining the purity of a deposited layer after formation. Desirably, such methods should be compatible with single-wafer, epitaxial silicon deposition chambers without increasing system costs, reducing wafer throughput, or increasing thermal budget. In some arrangements, these methods should not exhaust the thermal budget for SiGe alloys, and subsequent epitaxial layers. Further, there is a need to decrease the maximum process temperature reached during the purification of the substrate surface prior to deposition in order to allow processing of wafers that cannot be processed at the high temperatures reached during conventional cleaning methods. These and other needs are satisfied by several embodiments disclosed herein.

In accordance with one aspect of the present invention, a method is provided for treating a semiconductor substrate in a process chamber. The method includes providing a substrate having a semiconductor surface. The semiconductor surface is exposed to a Ge source vapor, thereby leaving a layer of Ge on the surface. The layer of Ge is removed from the surface of the substrate using an etchant.

In accordance with another aspect of the present invention, a method for treating a substrate is provided. The method includes loading a substrate having a silicon surface in a process chamber. The method includes a cleaning step comprising a cycle comprising forming $GeO_x$ on the silicon surface of the substrate surface in the process chamber; and subsequently removing the $GeO_x$ by providing an etchant gas to the process chamber.

In accordance with another aspect of the present invention, a method for preparing a substrate for deposition in a process chamber is provided. The method includes providing a substrate having a silicon surface. The substrate is exposed to a Ge source vapor. The substrate is then exposed to $Cl_2$ gas without exposing the substrate to other reactive gas streams between exposing the substrate to the Ge source vapor and exposing the substrate to the $Cl_2$ gas.

In accordance with another aspect of the present invention, an apparatus for processing a substrate is provided. The apparatus includes a process chamber configured to hold the substrate, a heating source configured to heat the substrate within the chamber, and a gas source configured to supply the process chamber with a Ge source vapor and an etchant source vapor. The apparatus also includes at least one controller, including a memory and a processor, configured to control the temperature of the substrate and sequentially supply the Ge source vapor under conditions selected to form $GeO_x$ on the substrate, the etchant vapor under conditions selected to remove substantially all of the $GeO_x$, and epitaxial deposition vapors.

In accordance with another aspect of the present invention, a semiconductor structure is provided. The semiconductor structure includes a bottom region comprising silicon with no germanium, a second region on top of the bottom region comprising a first Ge concentration having a thickness less than about 10 Å, and a third region on top of the second region having a second Ge concentration less than the first Ge concentration.

The low processing temperature of the Ge introduction and etch steps results in a significant decrease in the thermal load consumed in the cleaning process. Reactor throughput is increased because of the reduced heating and process time for the cleaning step. Additionally, after the oxide is removed the wafer is ready for the next in-situ deposition. The low temperature etch step is particularly advantageous for performing low temperature epitaxial processes carried out between 350° C. and 615° C., for example about 350-500° C. when using $Cl_2$ as an etchant and about 500-600° C. when using HCl as an etchant. The overlap in processing temperatures of the low temperature epitaxial processes and the etch step reduces the time, energy, and thermal budget consumption of heating and cooling the substrate and process chamber in conventional hydrogen bake steps.

DETAILED DESCRIPTION OF THE PREFERRED EMBODIMENT

While the embodiments of the present invention are discussed in the context of a single-substrate reaction chamber, the skilled artisan will appreciate that the principles and advantages taught herein will have application to deposition reactors of other types. Furthermore, while a series of process steps are disclosed herein, one of ordinary skill in the art will recognize the utility of certain of the disclosed steps even in the absence of some of the other disclosed steps, and similarly that subsequent, intervening or prior steps can be added.

As noted in the "Background" section above, the purity of a substrate surface can critically affect the quality of a layer deposited thereon, particularly for epitaxially deposited layers. A common source of contamination of semiconductor substrates is native oxide, which naturally forms on naked silicon or SiGe surfaces upon exposure to the atmosphere (e.g., clean room). Other contaminants such as carbon also tend to be found at the surface of semiconductor wafers, as received from wafer suppliers.

Such exposure and contamination is inevitable in transporting wafers from vendors to fabrication facilities, and transporting wafers among processing equipment or tools within a facility. For example, polished silicon wafers are typically provided by independent suppliers. Yet another set of suppliers often obtain wafers, apply epitaxial layers, and furnish these wafers to fabrication facilities. Even when epitaxial layers and later fabrication steps are performed at the same facility, wafers are often exposed to atmospheric contaminants and plastic handling equipment between processing steps in different parts of the facility.

Even with the HF last or other pre-clean treatment, epitaxial and other depositions over silicon-containing structures typically employ a pre-deposition bake step to remove any native oxide. Such bake steps, usually employing hydrogen as a reducing agent and therefore referred to as "hydrogen bake" steps, are typically conducted at relatively high temperatures for extended periods of time. Very high temperatures (900° C. to 1200° C.) are often employed for baking in conjunction with a subsequent high temperature epitaxial process. Even very low thermal budget bake processes after HF last treatment tend to employ baking temperatures between 700° C. and 900° C. See, e.g., U.S. Pat. No. 6,235,568, employing $GeH_4$, HCl and $H_2$ to remove native oxide.

Figure 1:
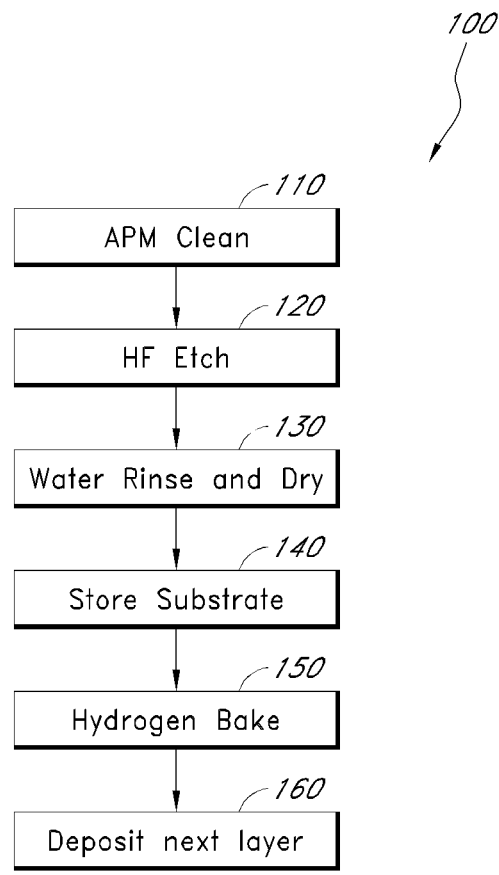
FIG. 1 is a flow chart generally showing a conventional wafer cleaning process.

Referring now to FIG. 1, a conventional method 100 for cleaning a silicon based substrate is described. The silicon based substrate is cleaned in an APM Clean step 110 that involves an ammonium hydroxide/hydrogen peroxide mixture (APM). The APM cleaning step 110 removes particles, surface defects, and Group I and Group II metals from the silicon wafer in the process of growing a chemical oxide.

After the APM step 110, an oxide layer is typically present on the surface of the silicon wafer. An HF etch 120 removes the oxide layer from the silicon wafer. The wafer is then rinsed 130 with ultrapure water to remove all HF acid and particles from the HF etch 120. After the water rinse 130 the wafer is dried. The water rinse 130 also passivates the surface of the wafer with hydrogen terminations that help to reduce oxide formation on the surface of the wafer. After the water rinse and drying 130, the wafer is sometimes stored 140 for sometime before being transported to and placed in a process chamber. The process chamber is sealed and purged. The wafer is then heated in a hydrogen bake 150. Conventional hydrogen bake 150 processes typically operate at 900° C. to 1200° C., with some lower temperature processes at as low as 700° C. to 900° C. The most efficient wafer hydrogen terminations require hydrogen baking temperatures between 600° C. and 750° C. Deposition 160 of the next layer can proceed after the hydrogen bake 150. If the deposition 160 is a low temperature epitaxial process, often the wafer will need to be first cooled from the bake temperature to the desired process temperature.

Such bake steps, however, reduce wafer throughput due to the time required for the bake step itself or for temperature cycling. In addition, such extended, high temperature bakes consume an unacceptable amount of thermal budget for devices with shallow junctions, causing uncontrolled migration of dopants in the semiconductor substrate. Accordingly, thermal budget consumption is disadvantageous for bake steps. Furthermore, the time required heating the substrate reduces wafer throughput, particularly where the subsequent epitaxial deposition is a low temperature process, entailing significant time to cool to deposition temperatures.

Consequently, there is a need for a low temperature process that will allow for removal of contaminants from the surface of a substrate while minimizing consumption of the thermal budget. Lower process temperatures and reductions in the thermal budget can also increase throughput by reducing or eliminating heating and cooling times. There is also a need for a process that allows for in-situ epitaxial deposition after the cleaning steps to reduce or eliminate exposure of the substrate to air.

Systems and methods are provided for low temperature cleaning of a semiconductor surface prior to in-situ deposition. A short, low temperature process consumes very little thermal budget, such that the process is suitable for advanced, high density circuits with pre-fabricated, shallow junctions, epitaxial SiGe alloys, and/or other advanced integrated circuit features. Furthermore, throughput is greatly improved by a low temperature cleaning process, particularly in combination with low temperature epitaxial deposition. Although embodiments are described with reference primarily to epitaxial deposition, for which cleaning is particularly critical, one skilled in the art will understand that cleaning as described herein can also be advantageous prior to non-epitaxial atomic layer deposition (ALD), chemical vapor deposition (CVD), physical vapor deposition (PVD), and other processes.

In one embodiment of the method, a substrate is loaded on a single-substrate support that idles at 500-600° C., preferably less than 550° C., and particularly at less than or equal to about 500° C. In addition to throughput and thermal budget advantages, another advantage of low temperature loading is that the protective termination, such as hydrogen terminations left by HF last processes, can be maintained even after loading on the hot susceptor until after the chamber has been purged. The surface of the loaded substrate is then exposed to a Ge source vapor. Typically, the Ge source vapor reacts with any native oxides on the surface of the substrate to form Ge-containing compounds such as $GeO_x$, for example GeO, $GeO_2$, etc., at substrate temperatures below 550° C., such as 350° C. to 500° C. for $Cl_2$. Preferably, the susceptor idles within the range of about 500-600° C. when HCl is used as the etchant. The process can also deposit an ultrathin Ge layer. The Ge and any GeOx formed can be subsequently removed in-situ using an etch gas, such as $Cl_2$, which is also effective at very low substrate temperatures or HCl, which can be effective at higher temperatures but still lower than etch steps without the prior Ge source exposure. The substrate is then free of native oxide and is ready for a low temperature epitaxial deposition with minimal or no heating or cooling. Reducing the temperature at which contaminants, such as oxide, are removed and the depositions are performed decreases thermal budget consumption and process cycle time.

Embodiments of the methods are presented in the context of a single-substrate, horizontal flow, cold wall reactor. "Single wafer" processing tools, in general, demonstrate greater process control and uniformity than traditional batch systems, but do so at the expense of throughput, since only one or at best a handful of substrates can be processed at one time. The basic configuration of the reactor is available commercially under the trade name Epsilon™ from ASM America, Inc. of Phoenix, Ariz. The reactor configuration can be as disclosed in U.S. Pat. No. 7,108,748 by Brabant et al., entitled "LOW TEMPERATURE LOAD AND BAKE," with reference to FIGS. 1-3 of the '748 patent.

Figure 2:
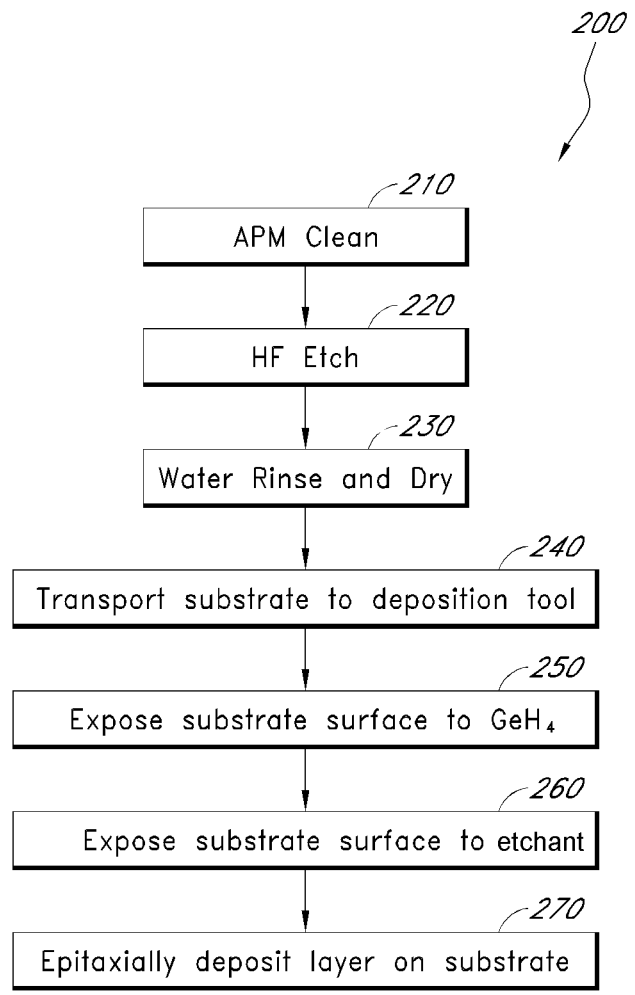
FIG. 2 is a flow chart generally illustrating a method for cleaning the surface of a wafer in accordance with one embodiment.

FIG. 2 illustrates a flow chart generally showing a cleaning process 200 in accordance with an embodiment. A substrate undergoes a first APM cleaning step 210, as discussed in the background and the description of FIG. 1. Next, the wafer is treated by an HF last step 220 to remove the oxide layer on the silicon wafer. The wafer is then rinsed with water and dried 230. The skilled artisan will appreciate that any other suitable pre-clean operation(s) can be employed in place of the illustrated APM clean 210, HF last 220 and rinse/dry 230. Chemical oxidation and removal by these or similar steps are conventional in the art, but numerous other ex-situ substrate cleaning processes are known in the art.

In embodiments employing a wet clean, preferably the water and reactants used for the etching and rinsing have low amounts of dissolved oxygen. In some embodiments, the water and other reactants used for the etching and rinsing are degassed to reduce the dissolved oxygen concentration. The chemicals used for the etching and rinsing can be prepared by the methods disclosed in U.S. Pat. No. 7,479,460 by Robert Pagliaro entitled "Silicon Surface Preparation". For example, the water used for the etching and rinsing can be exposed to ultraviolet radiation, filtered, degasified, and gasified with hydrogen. Preferably, ultrapure water is used.

Preferably, the dissolved concentration of oxygen in the chemicals used for the wet clean is below about 5 ppb. More preferably, the dissolved oxygen concentration in the wet clean chemicals is below the lower detection limit of 0 ppb.

After the wet clean, the substrate ideally has a hydrogen termination. Preferably, oxygen exposure to the hydrogen terminated substrate surface is kept to a minimum. In some embodiments, the surface density of oxygen after etching and rinsing is about $1-2*10^{13}$ at/$cm^2$ or about 1/50 of a monolayer.

Next the substrate is transported 240 to a deposition tool. Preferably the tool is a single wafer tool as described below, although the process can also be employed in batch tools. Preferably the substrate is provided with a passivated surface termination, e.g. hydrogen termination. In some embodiments native oxide is present on the substrate surface. The process chamber is sealed, purged, and evacuated. Next, the surface of the substrate is exposed 250 to a Ge source vapor, comprising $GeH_4$ in the illustrated embodiment. The temperature of the wafer during the Ge source exposure 250 is below about 600° C., and preferably equal to or less than 500° C., depending upon the etchant of choice. As an added benefit, these temperatures can be below the temperature at which hydrogen desorbs from the surface of the wafer. An exemplary temperature range is 350° C.-500° C. for $Cl_2$. An exemplary temperature range is 500° C.-600° C. for HCl. The low process temperature reduces the thermal load of the process and permits processing of more sensitive and complicated substrate structures. In some embodiments, the exposure 250 to a Ge source vapor can include any germanium compound that reacts at the desired temperatures with any oxygen on the surface to form $GeO_x$. Even the most efficient HF last 220 tends to leave or re-form some native oxides on the surface of the wafer, although typically less than a monolayer of oxygen. The Ge source vapor typically reacts with any of the native oxides that are present on the surface of the substrate, leaving Ge-containing compounds, such as $GeO_x$, on the surface of the wafer. In some embodiments of the method, introduction of the Ge source vapor can also be facilitated by an inert carrier gas such as nitrogen or hydrogen. The Ge source vapor exposure 250 tends also to leave an ultrathin layer of Ge on the substrate surface, in addition to any $GeO_x$. The exposure can be for between about 1 second and 1 minute, leaving anywhere from about 1 monolayer up to about 100 nm of Ge, depending on temperature, flow rate, and reactor configurations. The minimum exposure 250, however, is sufficient to react with any surface oxygen or native oxides.

Next, the surface of the substrate is exposed 260 to an etchant gas. In some embodiments of the methods, the process chamber can be purged and evacuated between the Ge source vapor exposure 250 and the etchant exposure 260. Any suitable etch gas can be used to remove the Ge and any $GeO_x$ from the surface of the substrate. Preferably a Cl-containing etchant is used for the etchant step 260. For example, $Cl_2$, HCl, atomic chlorine or excited species of chlorine can also be used as the etchant gas. The substrate temperature during the etch gas exposure 250 preferably remains below about 600° C., particularly between about 350° C. to about 600° C. Even at such low temperatures, HCl and $Cl_2$ gas are reactive enough to remove the deposited Ge and any formed $GeO_x$, even at temperatures as low as 350° C.-400° C., for example when $Cl_2$ is used as the etchant. The Ge source vapor exposure 250 and etchant gas exposure 260 can be performed at approximately the same process temperatures to minimize or eliminate heating or cooling between the steps. Preferably, the etchant exposure removes substantially all of the Ge and any $GeO_x$ from the substrate surface.

In some embodiments HCl is used as the etchant gas. Preferably, when HCl is used as the etchant gas, the substrate temperature is below about 615° C. Preferably, the substrate temperature during the HCl gas exposure remains between 500° C. and 600° C., and even more preferably between about 500° C. and about 590° C.

In some embodiments multiple cleaning cycles of forming $GeO_x$ and providing an etchant gas can be used. Preferably, each cleaning cycle comprises exposing the substrate to a Ge source and exposing the substrate to an etchant. For example, a cleaning cycle can comprise steps 250 and 260. Preferably, the etchant comprises a Cl-containing etchant, such as HCl or $Cl_2$, which removes Ge and $GeO_x$. Preferably, the Ge source comprises $GeH_4$.

The Ge source and etchant can be provided or pulsed into the chamber in the form of vapor phase pulses and contacted with the surface of the substrate. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Pulsing times can be on the order of minutes in some cases. The optimum pulsing time can be determined by the skilled artisan based on the particular circumstances.

Preferably, the pulse times and flow rates are optimized or tuned such that substantially all of the native oxide is removed from the silicon substrate surface. The process parameters can be selected such that substantially all of the deposited Ge and any $GeO_x$ are removed from the surface, although some residual Ge can diffuse into the first few angstroms of the substrate.

In some embodiments, the cleaning methods described herein remove substantially all of the native oxide, $GeO_x$, and Ge from substantially the entire processed substrate surface, including any compounds formed on different materials on the substrate surface.

Preferably, the pulsing time for the Ge source is less than 10 seconds. Preferably, the Ge source pulsing time is selected such that the minimum exposure is sufficient to react with substantially all of the surface oxygen and native oxides. Typically, pulsing the Ge source forms about 1 monolayer up to 100 nm of Ge.

Preferably, the pulsing time for the etchant is less than about 10 seconds. The pulsing time for the etchant can be selected such that substantially all of the $GeO_x$ and any deposited Ge is removed.

Preferably, the flow rate for the Ge source is about 500 sccm or less for a single wafer reaction chamber.

Preferably the flow rate for the etchant gas is about 500 sccm or less. More preferably, the etchant flow rate is between about 75 and 225 sccm.

The optimum flow rates and pulse lengths can be determined by the skilled artisan based on the particular circumstances in view of the disclosure herein.

In some embodiments, the process chamber can be purged and evacuated between the Ge source vapor exposure and etchant exposure and between cleaning cycles, e.g. after a cycle of Ge source exposure 250 and etchant exposure 260. In some embodiments, more than one cleaning cycle is used to remove oxide from the substrate surface. More preferably, about five cleaning cycles or less are used to remove oxide from the substrate surface. Most preferably, about two to three cleaning cycles are used to remove oxide from the substrate surface. In some embodiments, more than five cleaning cycles are used.

In some embodiments, a cleaning cycle can comprise exposing the substrate to a Ge source followed by providing multiple pulses of an etchant to the substrate. The process chamber can be purged and evacuated between the Ge source vapor exposure and the etchant exposure and/or between etchant pulses.

The low temperature oxide removal decreases the thermal load consumed by the process because less heating is required to process the substrate at lower temperatures compared to conventional hydrogen bake and in-situ etch processes prior to epitaxial deposition. Advantageously, the low temperature process consumes less thermal budget when processing substrates with sensitive features or structures.

In some embodiments, the methods described herein for removing native oxide can eliminate the need for a bake step prior to epitaxial depositing on the cleaned silicon surface, thus saving thermal budget.

After the surface is free of contaminants, the wafer is ready for in-situ deposition 270 of the next layer, which in the illustrated embodiment is an epitaxial deposition of a silicon-containing layer. In-situ deposition is advantageous because the wafer is not contaminated by exposure to air or oxygen between process steps. Preferably for in-situ processing, steps 250, 260, and 270 are conducted sequentially, with optional cyclical repetition of steps 250 and 260, without exposing the substrate to air. Embodiments of the cleaning method operating at low substrate temperatures, particularly between about 350° C. and about 600° C., are particularly efficient with low temperature epitaxial processes that operate in the same temperature range. Most efficiently, the cleaning process 250, 260 and epitaxially depositing 270 are all conducted at the same temperature within the 350° C. to 600° C. temperature window, depending upon choice of etchant. The decreased heating and cooling cycle times greatly increase throughput and decrease the thermal load and thermal budget consumption.

Figure 3:
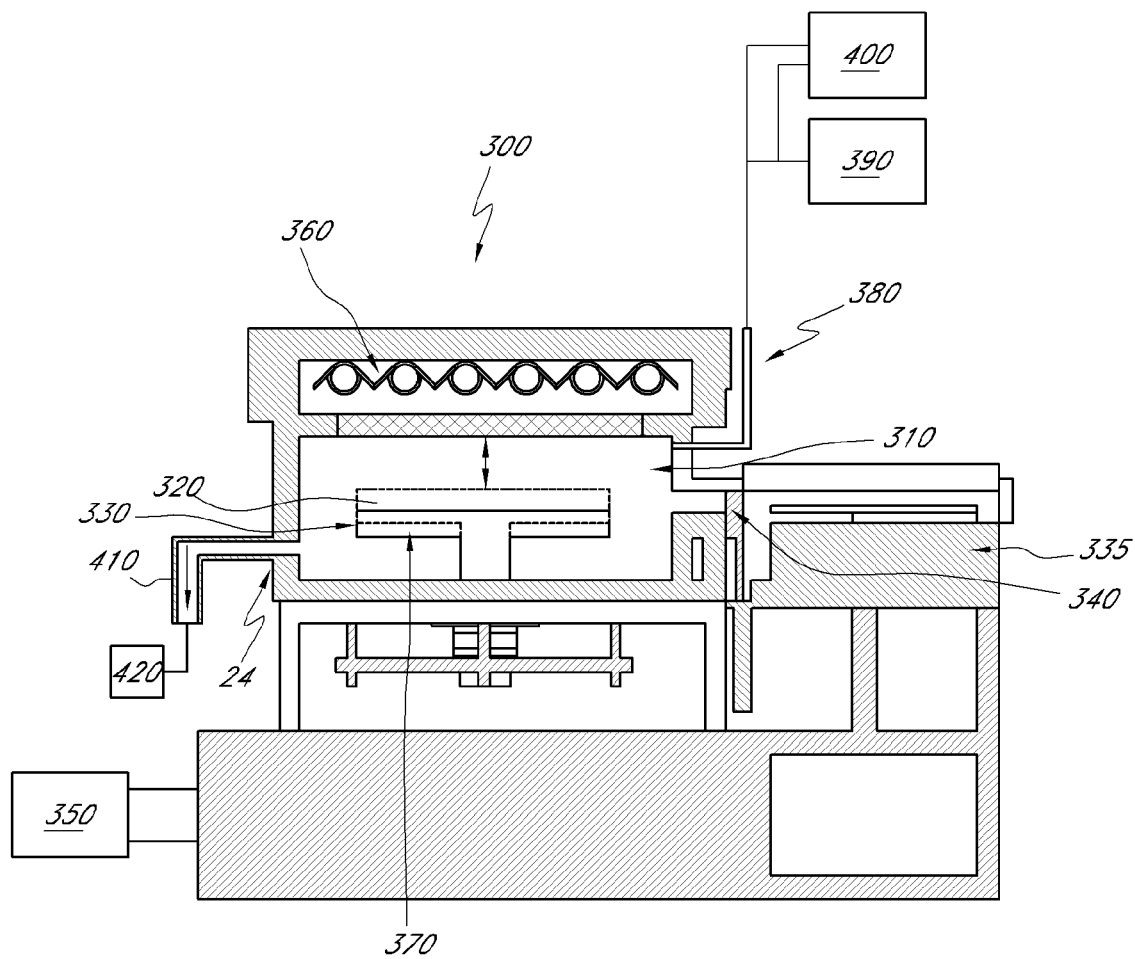
FIG. 3 is a schematic sectional view of a single-substrate reaction chamber.

FIG. 3 illustrates a schematic sectional view of a single-substrate reaction chamber. The single wafer reactor 300 is configured to hold and process one wafer at a time in a process chamber 310. The process chamber 310 is configured to hold a wafer 320 on top of a wafer support 330, which typically has a pocket sized for a single substrate. The wafer enters from a load lock 335 through a gate valve 340.

The temperature of the substrate in the process chamber 310 is controlled by a temperature controller 350. The temperature controller 350 controls the heat supplied to the substrate and process chamber from heat sources, such as the illustrated upper radiant heat source 360 and/or the illustrated resistively heated substrate platform heat source 370. Process gases, including the Ge source, etchant source, and deposition gases, are introduced from gas supply sources 390 to the process chamber 310 through a gas supply line 380. Flow from the gas supply sources 390 is controlled by a gas controller 400. Gas is evacuated and removed from the process chamber 310 through a gas vent 410 with the assistance of a vacuum pump 420. The temperature controller 350 and gas controller 400 are programmed to conduct the sequence of Ge source vapor, etchant source vapor, and epitaxial deposition gases described above for 250, 260, and 270 of FIG. 3. The gas controller 400 can also be programmed to perform the cleaning cycles described above, comprising cyclical repetition of steps 250 and 260. Preferably, the gas controller is programmed such that substantially all of the native oxide, $GeO_x$, and Ge are removed from the substrate surface.

The temperature controller 350 is programmed to maintain temperatures within the low temperature ranges described herein for the various etchants. In one embodiment, a constant temperature setpoint is employed for in-situ performance of all three sequential steps. For such in-situ processing, the three steps are conducted sequentially, with optional cyclical repetition of the first two steps prior to the third, without exposing the substrate to air.

The cleaning methods described herein can also produce a semiconductor surface comprising silicon with germanium atoms diffused just below the original substrate surface exposed to Ge vapor. The skilled artisan will appreciate that the "original" substrate refers only to the substrate prior to the Ge source exposure 250, and may include a previously formed epitaxial layer. Typically, Ge atoms diffuse less than 10 Å below the substrate surface cleaned via methods described herein. Diffusion of the Ge atoms below the semiconductor surface exposed to a Ge source vapor can occur in different process conditions, including after prolonged Ge exposure to the semiconductor surface and at higher temperatures, e.g. 500° C.-600° C. Some Ge atoms that diffuse below the top of the semiconductor surface are not removed by the etchant gas. These Ge atoms remain in the lattice structure of the semiconductor substrate. This is theoretically illustrated in FIGS. 4 and 5, which plot the Ge concentration versus depth below the top surface of the semiconductor.

Figure 4:
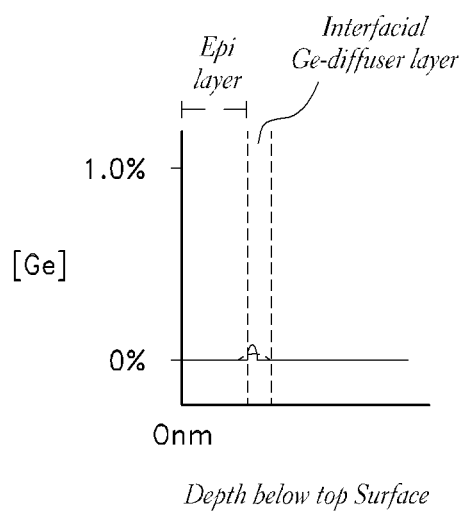
FIG. 4 is a theoretical graph showing germanium content against depth into a silicon epitaxial layer and underlying substrate, where the layer was deposited after cleaning the substrate in accordance with an embodiment.

FIG. 4 is a theoretical illustration of a silicon epitaxial layer on top of a semiconductor surface cleaned via methods described herein. The plot of the Ge concentration is relatively flat except for a small spike at a depth just below the original surface cleaned via methods described herein and on which the silicon epitaxial layer is formed. FIG. 4 illustrates two concentration spikes, one with a larger spike drawn with a solid line and another with a flatter bump drawn with a dotted line. The concentration spike with a flatter bump illustrates Ge contained below the silicon surface that later diffuses through the epitaxial layer and silicon semiconductor surface thereby flattening the Ge concentration spike.

Figure 5:
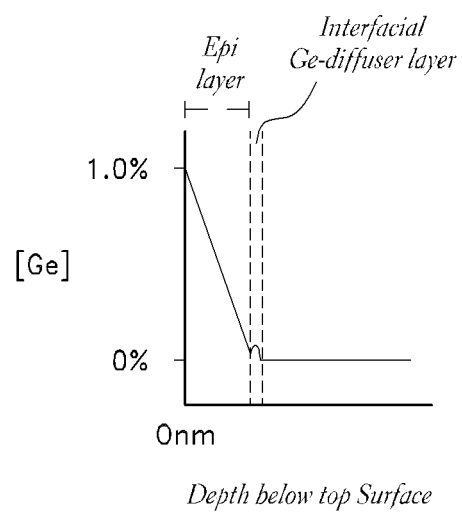
FIG. 5 is a theoretical graph showing germanium content against depth into a graded SiGe epitaxial layer and underlying substrate, where the layer was deposited after cleaning the substrate in accordance with an embodiment.

Some embodiments include, a semiconductor structure comprising a bottom region comprising silicon with no germanium; a second region, or interfacial Ge-diffused layer, on top of the bottom region comprising a first Ge concentration having a thickness less than about 10 Å; and a third region on top of the second region having a second Ge concentration less than the first Ge concentration. The second region typically includes silicon and a small Ge concentration. The top surface of the second region is typically cleaned via the methods described herein. During the cleaning, Ge atoms diffuse into the second region just below the surface, typically less than 10 Å below the top of the second region. The second region is represented by the "spike" illustrated in FIGS. 4 and 5. The third region typically includes silicon, silicon and germanium, or germanium. The composition of the third region can vary. In FIG. 4, the third region is silicon. In FIG. 5, the third region can have a low Ge concentration near the second region and a higher Ge concentration further away from the second region. Preferably, all three regions can have the same crystalline structure.

FIG. 5 is a theoretical illustration of a silicon germanium epitaxial layer on top of the semiconductor surface cleaned via methods described herein. The silicon germanium layer is graded, comprising a higher Ge concentration closer to the top of the semiconductor surface and a lower Ge concentration closer to the underlying silicon substrate surface. This plot also shows a small spike in Ge concentration at a depth just below the surface cleaned by methods described herein. FIG. 5 is the same as above except the Ge concentration can increase after the dip in Ge concentration just over the spike. The Ge spike would also be present in semiconductor surfaces having other compositions of materials epitaxially formed on top of the surface cleaned via methods described herein.

The processes described herein enable a low temperature method for removing oxide from silicon surfaces, providing very clean silicon surfaces for subsequent in-situ deposition. Accordingly, shallow junctions can maintain their integrity. Also, temperature sensitive partially fabricated devices can be cleaned with this method in contrast to conventional higher temperature hydrogen bake methods. Furthermore, the combination of the described low temperature cleaning process with relatively low temperature epitaxial deposition, conducted in-situ, allows for other considerable improvements in wafer throughput, lowering overall costs of operation. The above methods provide great results at low temperatures, without damage from low temperature plasma chamber cleaning, including increased throughput, while still maintaining the desired purity of state-of-the-art semiconductor fabrication.

The following non-limiting examples illustrate certain preferred embodiments of the invention.

EXAMPLE 1

Figure 6:
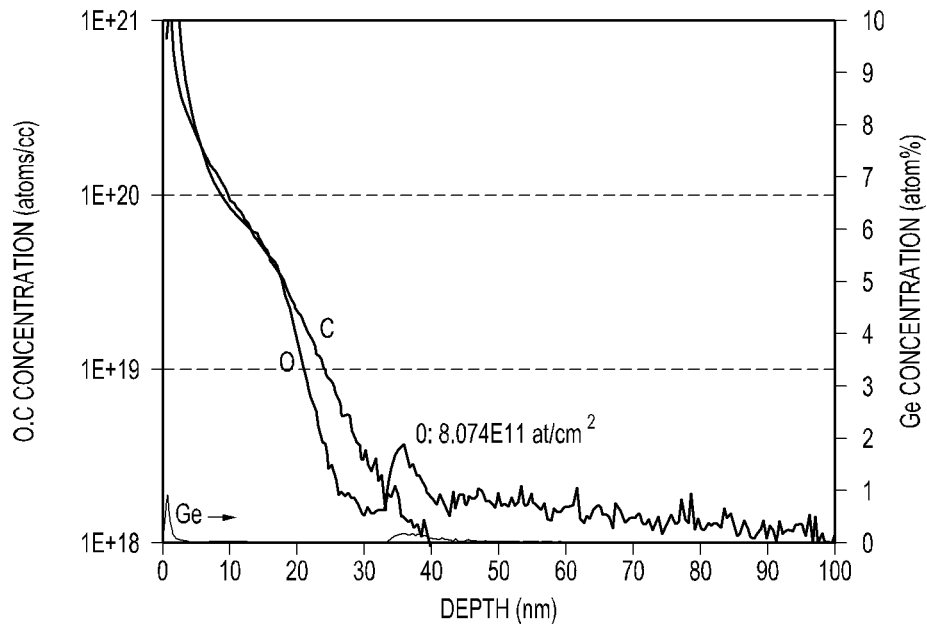
FIG. 6 illustrates a Secondary Ion Mass Spectroscopy (SIMS) image of a silicon film on a substrate.

FIG. 6 illustrates a Secondary Ion Mass Spectroscopy (SIMS) image of a cleaned silicon film on a substrate. The concentrations of oxygen and carbon are illustrated in atoms per cubic cm on the left y-axis and the germanium concentration is illustrated in atomic percent. The concentrations are plotted versus the depth of the sample substrate. To facilitate SIMS testing, an epitaxial silicon capping layer is deposited over the surface or film of interest to seal it for testing. Typically, the silicon capping layer is about 25 nm or thicker.

The silicon surface of the substrate was cleaned by providing $GeH_4$ to react with native oxide present on the substrate surface, thereby forming some $GeO_x$. Some of the $GeO_x$ compounds were removed by subsequently providing HCl. The process used to clean the interface in FIG. 6 was not optimized. Nevertheless, despite lack of optimization, the method left only approximately $8*10^{11}$ atoms per $cm^2$ of oxygen.

The silicon capping layer for the sample analyzed in FIG. 6 was about 38 nm thick. The cleaned silicon surface of the sample tested in FIG. 6 is thus illustrated at a depth of about 38 nm. FIG. 6 shows a spike in oxygen concentration at a depth of about 38 nm. The spike in oxygen concentration indicates that some residual oxygen was left at the cleaned silicon surface. The amount of oxygen left on the surface can be calculated in atoms/$cm^2$ by measuring the area under the concentration curve at the depth range of interest. The amount of oxygen present at the cleaned silicon interface illustrated in FIG. 6 was calculated to be approximately $8*10^{11}$ atoms per $cm^2$ by calculating the area under the oxygen concentration curve around the cleaned silicon interface.

The SIMS image also shows that some germanium is present around the cleaned interface, spiking briefly just below the wafer surface.

EXAMPLE 2

Figure 7:
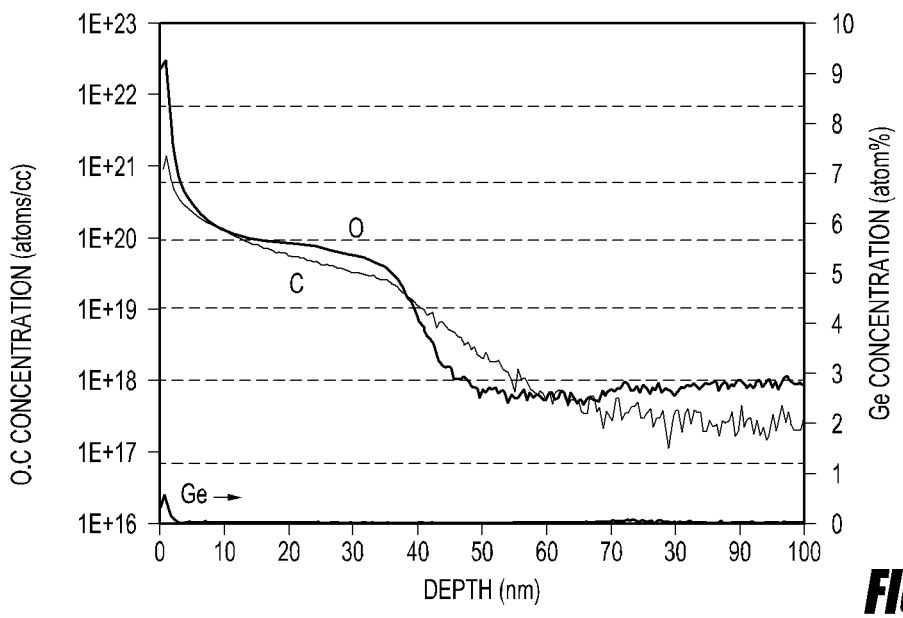
FIG. 7 illustrates a SIMS image of a silicon film on a substrate that was cleaned by a method in accordance with one embodiment.

FIG. 7 illustrates a SIMS image of a silicon film on a substrate cleaned by an optimized process comprising providing $GeH_4$ and HCl.

The silicon capping layer for the sample analyzed in FIG. 7 was about 65 nm thick. The cleaned silicon surface of the sample tested in FIG. 7 is thus illustrated at a depth of about 65 nm. No spike in oxygen concentration is observed at the cleaned interface in FIG. 7. The SIMS measurement for oxygen at the cleaned silicon surface was below the lower SIMS detection limit for oxygen. Thus, the SIMS data shown in FIG. 7 indicates that substantially all of the oxygen is removed by the optimized cleaning process comprising providing $GeH_4$ to form $GeO_x$ compounds and subsequently using HCl to remove the $GeO_x$ compounds.

Advantageously, the cleaning process used in FIG. 7 does not require a pre-epi temperature bake to remove or eliminate oxygen present on the surface of the substrate after the wet clean.

It will be appreciated by those skilled in the art that various modifications and changes can be made without departing from the scope of the invention. Similar other modifications and changes are intended to fall within the scope of the invention, as defined by the appended claims.

We claim:

1. A method for treating a substrate in a process chamber comprising:
   providing a substrate having exposed semiconductor surfaces;
   exposing all of the exposed semiconductor surfaces to a Ge source vapor, thereby leaving a layer of Ge deposited on all of the exposed semiconductor surfaces of the substrate; and
   removing substantially all of the layer of Ge left by said exposing from the exposed semiconductor surfaces of the substrate, wherein said removing uses an etchant.

2. The method of claim 1, wherein exposing the exposed semiconductor surfaces to the Ge source vapor comprises supplying $GeH_4$ to the process chamber.

3. The method of claim 1, wherein exposing and removing Ge are performed in the same process chamber.

4. The method of claim 1, wherein exposing and removing are performed without exposing the exposed semiconductor surfaces to air.

5. The method of claim 1, wherein exposing and removing are performed in a single wafer chamber.

6. The method of claim 1, further comprising purging the process chamber between exposing and removing.

7. The method of claim 1, wherein exposing comprises converting oxygen on the semiconductor surfaces to $GeO_x$; and wherein removing further comprises removing the $GeO_x$.

8. The method of claim 1, wherein the etchant comprises chlorine.

9. The method of claim 8, wherein the etchant is $Cl_2$.

10. The method of claim 9, wherein the substrate has a temperature less than about 550° C. when exposing and removing.

11. The method of claim 9, wherein the substrate has a temperature between about 350° C. and about 500° C. during exposing and removing.

12. The method of claim 9, wherein the substrate has a temperature between about 350° C. and about 400° C. during exposing and removing.

13. The method of claim 8, wherein the etchant is HCl.

14. The method of claim 13, wherein the substrate has a temperature between about 500° C. and about 600° C. during exposing and removing.

15. The method of claim 1, wherein the layer of Ge on the exposed surfaces is about 1 monolayer to about 5 monolayers thick.

16. The method of claim 1, wherein the layer of Ge on the surface is about 3 Å to about 15 Å thick.

17. The method of claim 1, wherein the layer of Ge on the surface is up to 100 μm.

18. The method of claim 1, wherein exposing is performed in about 1 second to about 60 seconds.

19. The method of claim 1, wherein removing is performed in about 1 second to about 60 seconds.

20. The method of claim 1, wherein removing is performed using atomic chlorine.

21. The method of claim 1, further comprising epitaxially forming a silicon-containing layer on top of the substrate after removing.

22. The method of claim 21, wherein the substrate temperature is approximately constant during exposing, removing, and epitaxially forming.

23. The method of claim 21, wherein the substrate has a temperature between about 350° C. and about 500° C. during, forming, removing, and epitaxially forming.

24. The method of claim 21, wherein exposing, removing, and epitaxially forming are performed without exposing the substrate to air.

25. A method for treating a substrate, comprising:
    loading a substrate having exposed silicon surfaces in a process chamber; and
    a cleaning step comprising a cycle comprising:
        forming $GeO_x$ on all of the exposed silicon surfaces of the substrate in the process chamber; and
        subsequently removing substantially all of the $GeO_x$ that was formed on all of the exposed silicon surfaces of the substrate by providing an etchant gas to the process chamber.

26. The method of claim 25, wherein the etchant gas is atomic chlorine.

27. The method of claim 25, wherein the etchant gas is $Cl_2$.

28. The method of claim 27, wherein the temperature of the substrate is between about 350° C. and 500° C. when forming the $GeO_x$ on the silicon surfaces and removing the $GeO_x$ using the etchant gas.

29. The method of claim 25, further comprising epitaxially depositing a silicon-containing layer on top of the substrate, after removing the $GeO_x$.

30. The method of claim 25, wherein the etchant gas is HCl.

31. The method of claim 30, wherein the temperature of the substrate is between about 500° C. and about 600° C. when forming and removing the $GeO_x$.

32. The method of claim 25, wherein the cleaning step comprises repeating the cycle of claim 26.

33. The method of claim 32, wherein the cleaning step comprises repeating the cycle of claim 26 less than about 5 times.

34. The method of claim 30, wherein removing the $GeO_x$ by providing an etchant gas comprises providing multiple pulses of the etchant gas to the process chamber.

35. The method of claim 25, wherein forming $GeO_x$ comprises forming a layer of Ge on the surfaces, wherein the layer of Ge is about 1 monolayer to about 5 monolayers thick.

36. The method of claim 1, wherein the exposed semiconductor surfaces on which the Ge is formed comprise substantially the entire substrate surface.

37. The method of claim 1, wherein the exposed semiconductor surfaces on which the Ge is formed comprise semiconductor windows among insulating surfaces on a patterned wafer.

* * * * *

UNITED STATES PATENT AND TRADEMARK OFFICE
CERTIFICATE OF CORRECTION

| | | |
|---|---|---|
| PATENT NO. | : 9,093,269 B2 | Page 1 of 1 |
| APPLICATION NO. | : 13/332211 | |
| DATED | : July 28, 2015 | |
| INVENTOR(S) | : Nyles W. Cody et al. | |

It is certified that error appears in the above-identified patent and that said Letters Patent is hereby corrected as shown below:

In the claims

In column 12 at line 55, In Claim 17, change "µm." to --nm.--.

In column 14 at line 6 (approx.), In Claim 32, change "claim 26." to --claim 25.--.

In column 14 at line 8 (approx.), In Claim 33, change "claim 26" to --claim 25--.

Signed and Sealed this
Thirty-first Day of May, 2016

Michelle K. Lee
*Director of the United States Patent and Trademark Office*